United States Patent
Kang et al.

(10) Patent No.: US 11,480,620 B2
(45) Date of Patent: Oct. 25, 2022

(54) METHOD FOR CALIBRATING STATE OF CHARGE OF BATTERY AND BATTERY MANAGEMENT SYSTEM

(71) Applicant: LG CHEM, LTD., Seoul (KR)

(72) Inventors: Tae-Kyu Kang, Daejeon (KR); Myeong-Hui Park, Daejeon (KR); Jung-Hwan Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 152 days.

(21) Appl. No.: 16/611,665

(22) PCT Filed: Dec. 13, 2018

(86) PCT No.: PCT/KR2018/015880
§ 371 (c)(1),
(2) Date: Nov. 7, 2019

(87) PCT Pub. No.: WO2019/124877
PCT Pub. Date: Jun. 27, 2019

(65) Prior Publication Data
US 2020/0341071 A1 Oct. 29, 2020

(30) Foreign Application Priority Data
Dec. 21, 2017 (KR) ........................ 10-2017-0177360

(51) Int. Cl.
*G01R 31/3842* (2019.01)
*G01R 31/3828* (2019.01)
*G01R 31/367* (2019.01)

(52) U.S. Cl.
CPC ....... *G01R 31/3842* (2019.01); *G01R 31/367* (2019.01); *G01R 31/3828* (2019.01)

(58) Field of Classification Search
None
See application file for complete search history.

(56) References Cited

U.S. PATENT DOCUMENTS

2002/0030494 A1 3/2002 Araki et al.
2003/0025506 A1* 2/2003 Arai .................... G01R 31/392
324/426

(Continued)

FOREIGN PATENT DOCUMENTS

CN 101312261 A 11/2008
CN 101971043 A 2/2011
(Continued)

OTHER PUBLICATIONS

Extended European Search Report dated Nov. 9, 2020, issued in corresponding European Patent Application No. 18892018.5.
(Continued)

*Primary Examiner* — Brent A. Fairbanks
(74) *Attorney, Agent, or Firm* — Morgan, Lewis & Bockius LLP

(57) ABSTRACT

Disclosed is a method and a battery management system for calibrating a state of charge of a battery. The method includes measuring a terminal voltage and a current of the battery, storing a measured voltage value indicating the terminal voltage and a measured current value indicating the current in a memory, updating a state of charge of the battery based on the measured current value, estimating an open-circuit voltage of the battery based on a first number of measured voltage values and a first number of measured current values in the order stored in the memory, storing an estimated voltage value indicating the open-circuit voltage in the memory, and calibrating the updated state of charge with a reference state of charge when a calibration condition is satisfied by a data set in which a second number of estimated voltage values sequentially stored in the memory are arranged in sequential order.

20 Claims, 5 Drawing Sheets

(56) References Cited

U.S. PATENT DOCUMENTS

| | | | |
|---|---|---|---|
| 2004/0162683 A1* | 8/2004 | Verbrugge | G01R 31/3828 702/64 |
| 2005/0154544 A1* | 7/2005 | Ono | G01R 31/3828 702/63 |
| 2007/0145948 A1* | 6/2007 | Lim | B60W 10/26 320/132 |
| 2008/0290833 A1 | 11/2008 | Hayashi | |
| 2010/0036626 A1 | 2/2010 | Kang et al. | |
| 2010/0280777 A1 | 11/2010 | Jin et al. | |
| 2010/0283471 A1 | 11/2010 | Lim et al. | |
| 2012/0091946 A1 | 4/2012 | Miyazawa et al. | |
| 2012/0101753 A1 | 4/2012 | Lin et al. | |
| 2013/0297243 A1 | 11/2013 | Baba et al. | |
| 2013/0300425 A1 | 11/2013 | Shiraishi et al. | |
| 2014/0009123 A1 | 1/2014 | Park et al. | |
| 2014/0152258 A1* | 6/2014 | LePort | H02J 7/0014 320/116 |
| 2014/0257726 A1 | 9/2014 | Baba et al. | |
| 2014/0368208 A1 | 12/2014 | Yamada | |
| 2015/0231986 A1* | 8/2015 | Li | B60L 58/13 903/903 |
| 2017/0176541 A1 | 6/2017 | Shimizu | |
| 2017/0199250 A1* | 7/2017 | Yoon | G01R 31/3828 |
| 2018/0024200 A1 | 1/2018 | Hiwa | |
| 2018/0095141 A1 | 4/2018 | Wild et al. | |
| 2019/0339332 A1* | 11/2019 | Tachibana | H01M 10/441 |

FOREIGN PATENT DOCUMENTS

| | | |
|---|---|---|
| CN | 102162836 A | 8/2011 |
| CN | 102437629 A | 5/2012 |
| CN | 104360280 A | 2/2015 |
| CN | 105548898 A | 5/2016 |
| CN | 106443459 A | 2/2017 |
| CN | 106646265 A | 5/2017 |
| CN | 106872906 A | 6/2017 |
| EP | 2 442 126 A2 | 4/2012 |
| EP | 2 667 211 A1 | 11/2013 |
| EP | 2 765 436 A1 | 8/2014 |
| JP | 2002-051470 A | 2/2002 |
| JP | 2010-066232 A | 3/2010 |
| JP | 2011-106952 A | 6/2011 |
| JP | 2012-57998 A | 3/2012 |
| JP | 2012-058028 A | 3/2012 |
| JP | 1997358 B2 | 8/2012 |
| JP | 2014-032825 A | 2/2014 |
| JP | 5897701 B2 | 3/2016 |
| JP | 2017-062149 A | 3/2017 |
| JP | 6119554 B2 | 4/2017 |
| JP | 2017-122622 A | 7/2017 |
| JP | 2017-167163 A | 9/2017 |
| JP | 6201899 B2 | 9/2017 |
| KR | 10-2010-0019249 A | 2/2010 |
| KR | 10-2012-0082965 A | 7/2012 |
| KR | 10-2012-0120889 A | 11/2012 |
| KR | 10-2014-0070790 A | 6/2014 |
| KR | 10-2014-0133318 A | 11/2014 |
| KR | 10-1498764 B1 | 3/2015 |
| KR | 10-2016-0051327 A | 5/2016 |
| KR | 10-2017-0138488 A | 12/2017 |
| WO | 2016/129248 A | 12/2017 |

OTHER PUBLICATIONS

Office Action dated Apr. 27, 2021, issued in corresponding Chinese Patent Application No. 201880031328.6.
International Search Report issued in corresponding International Patent Application No. PCT/KR2018/015880, dated Mar. 20, 2019.
Office Action dated Oct. 18, 2021, issued in corresponding Chinese Patent Application No. 201880031328.6.

* cited by examiner

METHOD FOR CALIBRATING STATE OF CHARGE OF BATTERY AND BATTERY MANAGEMENT SYSTEM

TECHNICAL FIELD

The present disclosure relates to a method and a battery management system for calibrating a state of charge of a battery.

The present application claims priority to Korean Patent Application No. 10-2017-0177360 filed in the Republic of Korea on Dec. 21, 2017, the disclosure of which is incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

To stably use various types of devices or systems that are supplied with energy from batteries, the process of periodically estimating the State Of Charge (SOC) of the batteries is essential. In particular, the SOC of the battery is a parameter indicating how long the battery will be stably usable.

In general, the SOC of the battery is expressed as a percentage of the current remaining capacity to a given full charge capacity. The remaining capacity is difficult to directly measure, and it is necessary to estimate the remaining capacity based on the voltage and/or the current of the battery.

It is current integration (ampere counting) that is typically used to estimate the SOC of the battery. The current integration method is also called coulomb counting, and includes calculating the remaining capacity from the result of integrating the current of the battery periodically measured by a current sensor over time.

However, the disadvantage of the current integration method is that accuracy in SOC estimation reduces over time due to a measurement error of the current sensor. Accordingly, it is undesirable to estimate the SOC of the battery using the current integration method alone, and it is necessary to properly calibrate the SOC of the battery estimated by the current integration method.

Meanwhile, another way to estimate the SOC of the battery is to use the OCV-SOC curve. In detail, SOC estimation using the OCV-SOC curve measures the open-circuit voltage (OCV) of the battery and estimates SOC corresponding to the measured OCV from given OCV-SOC curve data. Because SOC estimation using the OCV-SOC curve does not use a current sensor, it is possible to avoid the problem with SOC estimation accuracy decreasing over time.

However, SOC estimation using the OCV-SOC curve needs to measure the OCV of the battery, and the OCV of the battery can be only measured when the battery is kept in no-load condition for a predetermined time or longer. Accordingly, when the battery is not kept in no-load condition and is being charged or discharged for the predetermined time or longer, it is impossible to measure the OCV of the battery.

DISCLOSURE

Technical Problem

The present disclosure is designed to solve the above-described problem, and therefore, the present disclosure is directed to providing a method and a battery management system for calibrating a state of charge (SOC) of a battery estimated by the current integration method irrespective of whether the battery is being charged/discharged.

These and other objects and advantages of the present disclosure will be understood by the following description and will be apparent from the embodiments of the present disclosure. Further, it will be readily understood that the objects and advantages of the present disclosure can be realized by the means set forth in the appended claims and combinations thereof.

Technical Solution

Various embodiments of the present disclosure for achieving the above-described object are as follows.

A method for calibrating a state of charge (SOC) of a battery according to an embodiment of the present disclosure includes measuring a terminal voltage and a current of the battery, storing a measured voltage value indicating the measured terminal voltage and a measured current value indicating the measured current in a memory, updating the SOC of the battery based on the measured current value using a current integration, estimating an open-circuit voltage (OCV) of the battery based on a first number of measured voltage values and a first number of measured current values in the order lately stored in the memory when the first number or more of measured voltage values and the first number of measured current values or more are sequentially stored in the memory, storing an estimated voltage value indicating the estimated OCV in the memory, generating a data set including a second number of estimated voltage values arranged in a sequential order from the second number of estimated voltage values in the order lately stored in the memory when the second number or more of estimated voltage values are sequentially stored in the memory, and calibrating the updated SOC with a reference SOC when a calibration condition is satisfied by the data set.

Estimating the OCV of the battery may use a least square method associated with an equivalent circuit model of the battery. In this case, the equivalent circuit model includes a voltage source, an Ohmic resistance and at least one parallel RC circuit, connected in series.

Estimating the OCV of the battery may be performed when an estimation condition is satisfied by the first number of current values.

Estimating the OCV of the battery may include estimating that the OCV is equal to a previously estimated OCV when the estimation condition is not satisfied by the first number of current values.

The estimation condition may be satisfied when a difference between a maximum current value of the first number of current values and a minimum current value of the first number of current values is equal to or larger than a reference current value.

The calibration condition may be satisfied when (i) a difference between a reference voltage value corresponding to the reference SOC and the estimated voltage value is less than a first voltage difference value, and (ii) a difference between two adjacent estimated voltage values in the data set is less than a second voltage difference value.

The first voltage difference value may be smaller than the second voltage difference value.

The method may further include updating the reference SOC based on the updated SOC.

A battery management system for calibrating a SOC of a battery according to another embodiment of the present disclosure includes a memory, a sensing unit configured to measure a terminal voltage and a current of the battery, and a control unit operably coupled to the memory and the sensing unit. The control unit stores a measured voltage value indicating the measured terminal voltage and a measured current value indicating the measured current in the memory. The control unit updates the SOC of the battery based on the measured current value using current integration. The control unit estimates an OCV of the battery based on a first number of measured voltage values and a first number of measured current values in the order lately stored in the memory when the first number or more of measured voltage values and the first number of measured current values or more are sequentially stored in the memory. The control unit stores an estimated voltage value indicating the estimated OCV in the memory. The control unit generates a data set including a second number of estimated voltage values arranged in a sequential order from the second number of estimated voltage values in the order lately stored in the memory when the second number or more of estimated voltage values are sequentially stored in the memory. The control unit calibrates the updated SOC with a reference SOC when a calibration condition is satisfied by the data set.

The calibration condition may be satisfied when (i) a difference between a reference voltage value corresponding to the reference SOC and the estimated voltage value is less than a first voltage difference value, and (ii) a difference between two adjacent estimated voltage values in the data set is less than a second voltage difference value.

The control unit may update the reference SOC based on the updated SOC.

A battery pack according to still another embodiment of the present disclosure includes the battery management system.

Advantageous Effects

According to at least one of the embodiments of the present disclosure, it is possible to calibrate a state of charge (SOC) of a battery estimated by the current integration method based on an open-circuit voltage (OCV) of the battery that is periodically estimated based on the terminal voltage and the current of the battery, irrespective of whether the battery is being charged/discharged.

The effects of the present disclosure are not limited to the above-mentioned effects, and other effects not mentioned herein will be clearly understood by those skilled in the art from the appended claims.

DESCRIPTION OF DRAWINGS

The accompanying drawings illustrate an embodiment of the present disclosure, and together with the following detailed description, serve to provide a further understanding of the technical aspects of the present disclosure, and thus the present disclosure should not be construed as limited to the drawings.

MODE FOR DISCLOSURE

Figure 1:
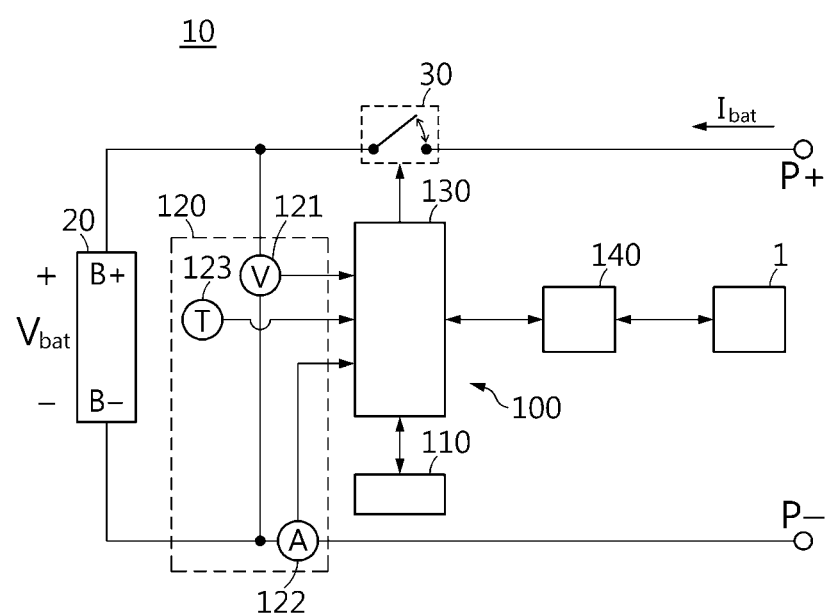
FIG. 1 is a diagram showing the functional configuration of a battery pack according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and variations could be made thereto at the time of filing the application.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented in hardware or software alone or in combination.

In addition, throughout the specification, it will be further understood that when an element is referred to as being "connected to" another element, it can be directly connected to the other element or intervening elements may be present.

FIG. 1 is a diagram showing the functional configuration of a battery pack 10 according to an embodiment of the present disclosure.

Referring to FIG. 1, the battery pack 10 includes a battery 20, a contactor 30 and a battery management system 100.

The battery 20 includes a positive terminal B+ and a negative terminal B−. The battery 20 may include at least one unit cell. When the battery 20 includes a plurality of unit cells, the plurality of unit cells may be electrically connected in series or in parallel. Each unit cell may be, for example, a lithium ion battery, a lithium polymer battery, a nickel cadmium battery, a nickel hydrogen battery and a nickel zinc battery. Of course, the type of the unit cell is not limited to the list of types described above, and includes any type of battery that can be recharged repeatedly.

The contactor 30 is installed on a high current path of the battery pack 10 to adjust the charge/discharge current of the battery pack 10. The high current path of the battery pack 10 may include a path between the positive terminal B+ of the battery 20 and a positive terminal P+ of the battery pack 10 and a path between the negative terminal B− of the battery 20 and a negative terminal P− of the battery pack 10. Although FIG. 1 shows that the contactor 30 is installed between the positive terminal P+ of the battery pack 10 and the positive terminal B+ of the battery 20, the installation location of the contactor 30 is not limited thereto. For example, the contactor 30 may be installed between the negative terminal P− of the battery pack 10 and the negative terminal B− of the battery 20.

The contactor 30 may be turned on or off according to a switching signal from the battery management system 100 to adjust the current of the battery 20.

The battery management system 100 may include a memory 110, a sensing unit 120 and a control unit 130, and optionally, may further include a communication unit 140.

The memory 110 is not limited to a particular type and includes any storage medium capable of recording and erasing information. For example, the memory 110 may include at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM). Additionally, the memory 110 may store programs including various control logics that can be executed by the control unit 130. Additionally, the memory 110 may store data indicating the results of the control logics executed by the control unit 130.

The sensing unit 120 may include a voltage sensor and a current sensor, and optionally, may further include a temperature sensor. Each of the voltage sensor 121, the current sensor 122 and the temperature sensor may be operably connected to the control unit 130.

The voltage sensor 121 measures a terminal voltage of the battery 20 and transmits a voltage signal indicating the measured terminal voltage to the control unit 130. The terminal voltage corresponds to a potential difference between the positive terminal B+ and the negative terminal B−. The control unit 130 stores a measured voltage value indicating the measured terminal voltage in the memory 110 based on the voltage signal transmitted from the voltage sensor 121.

The current sensor 122 measures a current of the battery 20 and transmits a current signal indicating the measured current to the control unit 130. The control unit 130 stores a current value indicating the measured current in the memory 110 based on the current signal transmitted from the current sensor 122.

The temperature sensor 123 measures a temperature of the battery 20 and transmits a temperature signal indicating the measured temperature to the control unit 130. The control unit 130 stores a temperature value indicating the measured temperature in the memory 110 based on the temperature signal transmitted from the temperature sensor 123.

The control unit 130 may be operably connected to the memory 110, the sensing unit 120, the communication unit 140 and the contactor 30 to individually control the operation of each of the memory 110, the sensing unit 120, the communication unit 140 and the contactor 30. The control unit 130 may be physically implemented using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The control unit 130 may update the state of charge (SOC) of the battery 20 based on the current value stored in the memory 110 using current integration. Assume that the current value indicating the current measured during charging of the battery 20 has the positive sign and the current value indicating the current measured during discharging of the battery 20 has the negative sign, the current integration may be expressed as the following Equation 1.

$$SOC(t_n) = SOC(t_{n-1}) + \frac{I_{bat}(t_n)\Delta t}{Q_{full}} \times 100 \qquad \text{<Equation 1>}$$

In Equation 1, $\Delta t$ is a given measurement cycle (e.g., 0.001 sec), $t_n$ is the time point after $n\Delta t$ has elapsed from an initial time point (i.e., the measurement time point at the $n^{th}$ cycle), $t_{n-1}$ is the time point after $(n-1)\Delta t$ has elapsed from the initial time point, $I_{bat}(t_n)$ is the measured current value indicating the current measured at $t_n$, QUI is the full charge capacity of the battery 20, $SOC(t_{n-1})$ is the SOC at $t_{n-1}$, and $SOC(t_n)$ is the SOC at $t_n$. Those skilled in the art will easily understand $t_i$=initial time point+$i\Delta t$, and $\Delta t=t_i-t_{i-1}$. The initial time point may be the time point at which a predetermined initialization event occurred. The initialization event may be, for example, an event that charging or discharging of the battery 20 starts in no-load condition, or an event that the SOC of the battery 20 is calibrated.

Figure 2:
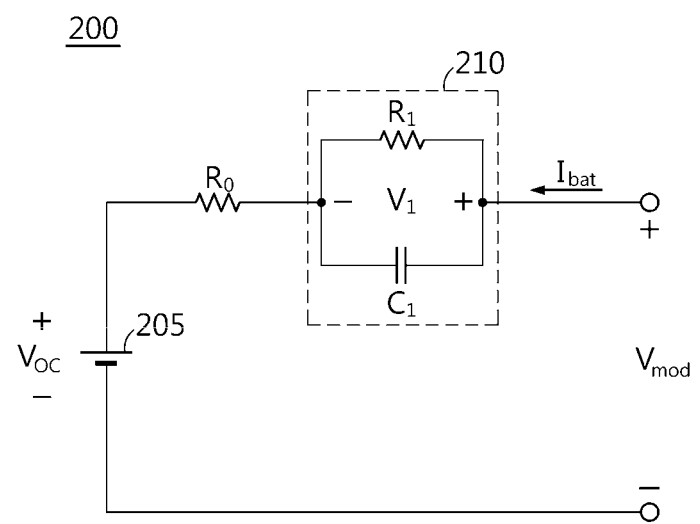
FIG. 2 is a diagram showing an exemplary equivalent circuit model of a battery shown in FIG. 1.

FIG. 2 is a diagram showing an exemplary equivalent circuit model 200 of the battery 20 shown in FIG. 1.

Referring to FIG. 2, the equivalent circuit model 200 includes a voltage source 205, an Ohmic resistance $R_0$ and a parallel RC circuit 210, electrically connected in series to each other. The voltage source 205 is used to indicate the open-circuit voltage (OCV) of the battery 20. The Ohmic resistance $R_0$ is used to indicate an internal resistance of the battery 20. The parallel RC circuit 210 is used to indicate a polarization voltage of the battery 20, and includes resistance $R_1$ and capacitance $C_1$ electrically connected in parallel. Of course, the equivalent circuit model 200 may further include one or more additional parallel RC circuits (not shown).

As shown in FIG. 2, when the number of parallel RC circuits 210 included in the equivalent circuit model 200 is one, a model voltage value indicating a terminal voltage of the equivalent circuit model 200 at $t_n$ may be expressed as the following Equation 2.

$$V_{mod}(t_n) = V_{oc}(t_n) + R_0 I_{bat}(t_n) + V_1(t_n) \qquad \text{<Equation 2>}$$

$V_{oc}(t_n)$ is the OCV of the battery 20 at $t_n$, $R_0$ is the internal resistance of the battery 20, $V_1(t_n)$ is the polarization voltage at $t_n$, and $V_{mod}(t_n)$ is the model voltage value at $t_n$.

Figure 3:
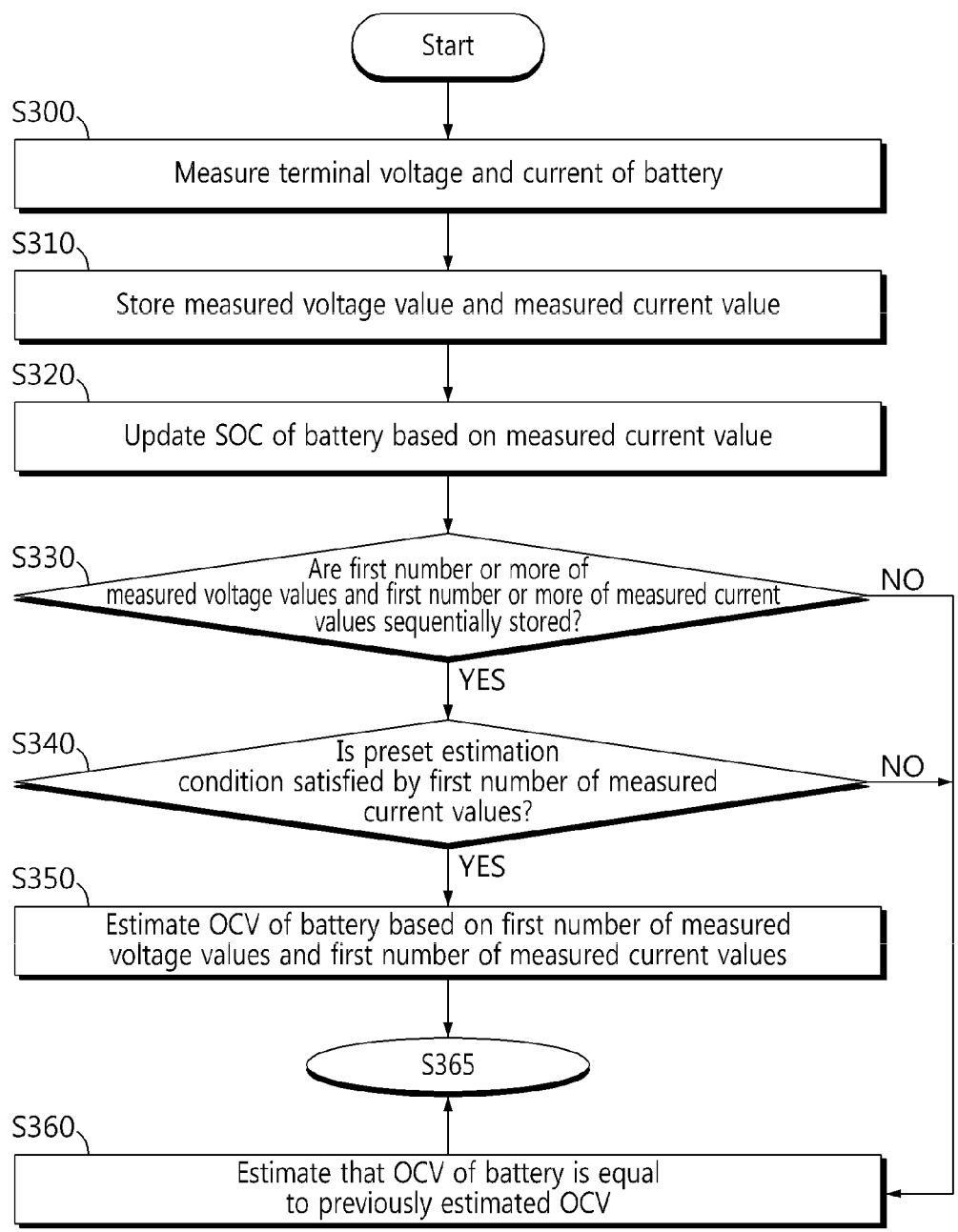
FIGS. 3 and 4 are flowcharts showing a method for calibrating a state of charge of a battery according to another embodiment of the present disclosure.
Figure 4:
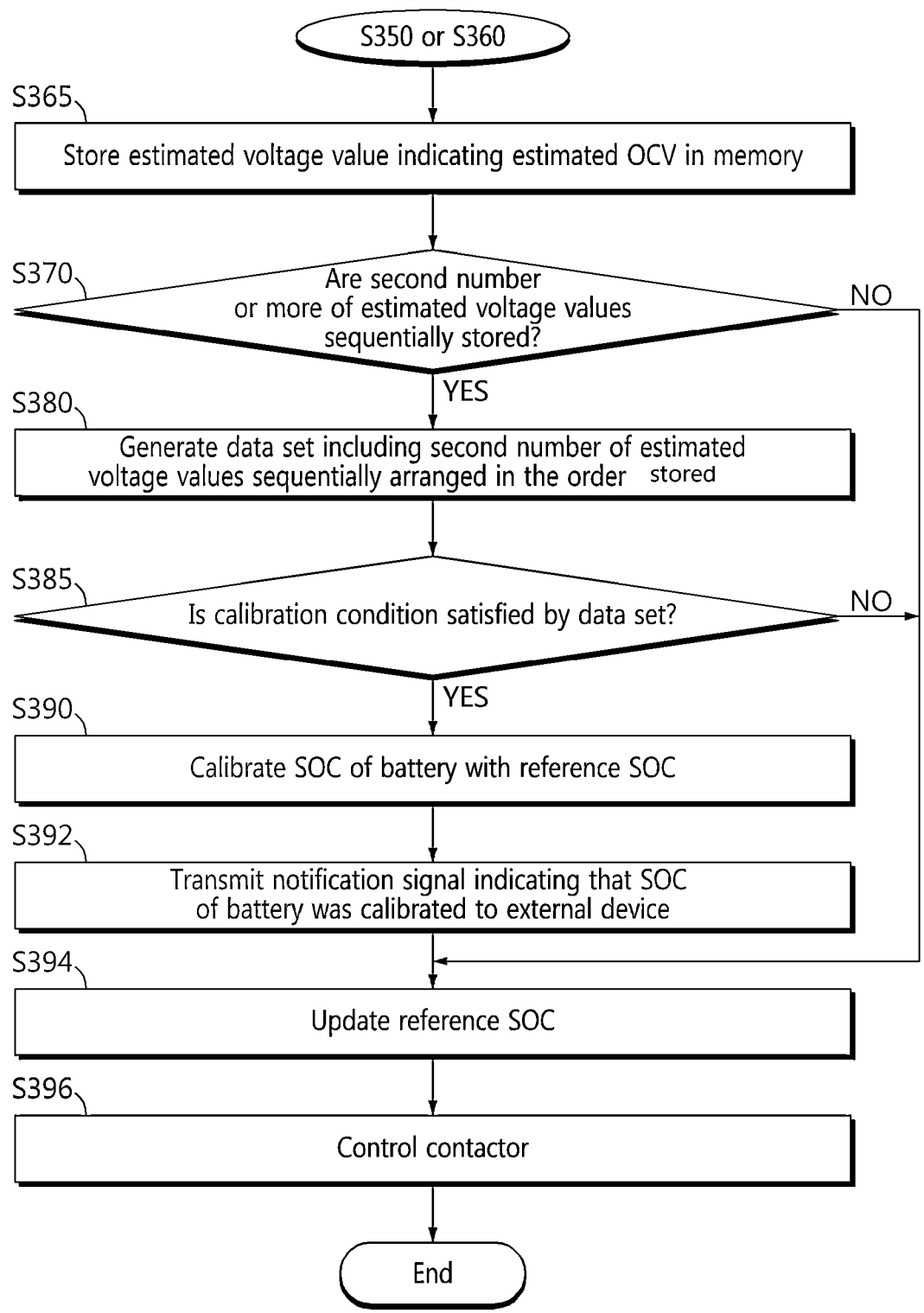
Figure 5:
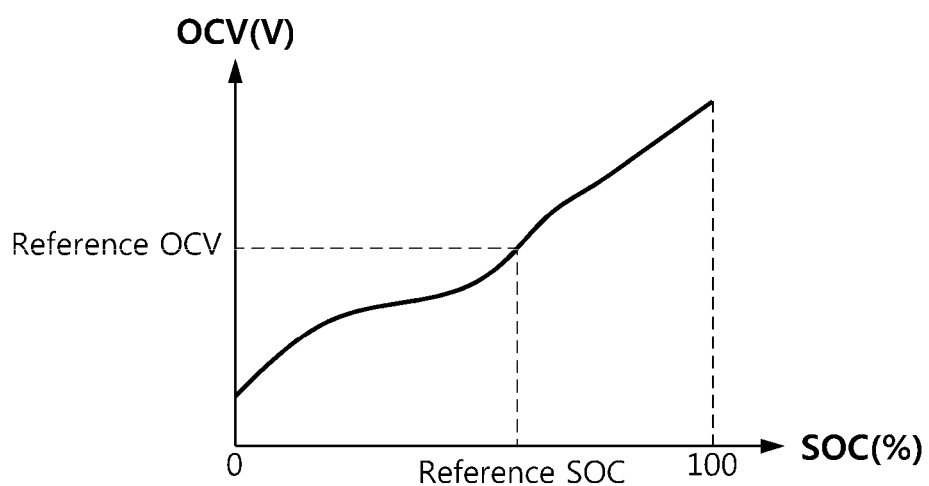
FIG. 5 is a graph showing a correlation between an open-circuit voltage and a state of charge of a battery.

FIGS. 3 and 4 are flowcharts showing a method for calibrating the SOC of the battery 20 according to another embodiment of the present disclosure, and FIG. 5 is a graph showing a correlation between the OCV and the SOC of the battery 20. The method shown in FIGS. 3 and 4 may be periodically performed for a predetermined period (e.g., $\Delta t$).

Referring to FIGS. 1 to 4, in step S300, the control unit 130 measures the terminal voltage and the current of the battery 20 at $t_n$ using the sensing unit 120. Optionally, the control unit 130 may further measure the temperature of the battery 20 at $t_n$.

In step S310, the control unit 130 stores a measured voltage value indicating the terminal voltage measured at $t_n$ and a measured current value indicating the current measured at $t_n$ in the memory 110. In this instance, (n−1) measured voltage values and (n−1) measured current values measured for the period from $t_1$ to $t_{n-1}$ are stored in the memory 110. Optionally, the control unit 130 may store a measured temperature value indicating the temperature measured at $t_n$ in the memory 110.

In step S320, the control unit 130 updates the SOC of the battery 20 based on the measured current value measured at $t_n$ using current integration. That is, the control unit 130 may estimate $SOC(t_n)$, i.e., the SOC of the battery 20 at $t_n$ (see Equation 1). In this instance, the control unit 130 may use the above-described Equation 1. Data indicating the previous SOC, i.e., $SOC(t_{n-1})$, may be stored in the memory 110.

In step S330, the control unit 130 determines whether a first number or more of measured voltage values and a first number or more of measured current values are sequentially stored in the memory 110. Hereinafter, assume that the first number a is 2 or greater. n measured voltage values and n measured current values are each stored in the memory 110 through the step S310, and thus, in step S330, the control unit 130 determines whether n≥a. The first number a is a minimum number (e.g., 2000) required to estimate the OCV of the battery 20 with a predetermined level of accuracy or above, and it may be an experimentally preset value. For example, in case that first number a=2000, when $t_n \geq t_{2000}$, the value of the step S330 is "YES". In contrast, when $t_n < t_{2000}$, the value of the step S330 is "NO". When the value of the step S330 is "YES", the step S340 is performed. When the value of the step S330 is "NO", the step S360 is performed.

In step S340, the control unit 130 determines whether a preset estimation condition is satisfied by the first number of measured current values. The estimation condition may be satisfied, for example, when (i) a difference between the maximum current value of the first number of measured current values and the minimum current value of the first number of measured current values is equal to or larger than a reference current value (e.g., 90A) and/or (ii) each of the number of negative values of the first number of measured current values and the number of positive values of the first number of measured current values is equal to or larger than a predetermined number. Each of the estimation conditions (i) and (ii) is used to check whether a change of current for the period from $t_{n-a+1}$ to $t_n$ sufficiently causes a change in voltage across two ends of each of the Ohmic resistance $R_0$ and the parallel RC circuit 210. When the value of the step S340 is "YES", step S350 is performed. When the value of the step S340 is "NO", step S360 is performed.

In step S350, the control unit 130 estimates the OCV of the battery 20 based on the first number of measured voltage values and the first number of measured current values in the order lately stored in the memory 110.

$V_1(t_n)$ in Equation 2 may be expressed as the following Equation 3.

$$V_1(t_n) = V_1(t_{n-a})\exp^{-\frac{t_n}{\tau_1}} + \sum_{i=n-a+1}^{n}\left\{R_1 I_{bat}(t_i)\left(\exp^{-\frac{t_{n-i}}{\tau_1}} - \exp^{-\frac{t_{n-i+1}}{\tau_1}}\right)\right\}$$ <Equation 3>

In Equation 3, $\tau_1$ is a given time constant for the parallel RC circuit 210. In Equations 2 and 3, $V_{oc}(t_n)$, $R_0$, $R_1$ and $V_1(t_n)$ may be each an unknown value that can be estimated as described below. Of course, the voltage $V_1(t_n)$ of the parallel RC circuit 210 may be differently expressed from Equation 3.

When the measured voltage value indicating the terminal voltage measured at $t_i$ is indicated as '$V_{bat}(t_i)$', the first number of measured voltage values are expressed as a×1 matrix as shown in the following Equation 4.

$$V_{bat\_v}=[V_{bat}(t_{n-a+1})V_{bat}(t_{n-a+2})V_{bat}(t_{n-a+3})\cdots V_{bat}(t_{n-1})V_{bat}(t_n)]^T$$ <Equation 4>

When the measured current value indicating the current measured at $t_i$ is indicated as '$I_{bat}(t_i)$', the first number of measured current values are expressed as a×1 matrix as shown in the following Equation 5.

$$I_{bat\_v}=[I_{bat}(t_{n-a+1})I_{bat}(t_{n-a+2})I_{bat}(t_{n-a+3})\cdots I_{bat}(t_{n-1})I_{bat}(t_n)]^T$$ <Equation 5>

When the model voltage value at $t_i$ is indicated as '$V_{mod}(t_i)$', the first number of model voltage values are expressed as a×1 matrix as shown in the following Equation 6 from Equation 2.

$$V_{mod\_v}=[V_{mod}(t_{n-a+1})V_{mod}(t_{n-a+2})V_{mod}(t_{n-a+3})\cdots V_{mod}(t_{n-1})V_{mod}(t_n)]^T$$ <Equation 6>

Let us define r, $K_v$, $J_v$, $1_v$ as below.

$$r = \exp\left(-\frac{\Delta t}{\tau_1}\right)$$

$$K_v = [r \ r^2 \ r^3 \ \cdots \ r^a]^T$$

$$J_v = (1-r)\begin{bmatrix} 1 & 0 & 0 & \cdots & 0 \\ r & 1 & 0 & \cdots & 0 \\ r^2 & r & 1 & \cdots & 0 \\ \vdots & \vdots & \vdots & \ddots & \vdots \\ r^{a-1} & r^{a-2} & r^{a-3} & \cdots & 1 \end{bmatrix} I_{bat\_v}$$

$$1_v = [1 \ 1 \ 1 \ \cdots \ 1]^T$$

r is the constant, and each of $K_v$, $J_v$, $1_v$ is a×1 matrix.

Assume that OCV $V_{oc}(t_i)$ by the voltage source 205 is constant as $V_{oc\_n}$ for the period from $t_{n-a}$ to $t_n$, Equation 6 may be expressed as the following Equation 7 by the above assumptions.

$$V_{mod\_v}=[1_v I_{bat\_v} K_v J_v][V_{oc\_n} R_0 V_1(t_{n-a}) R_1]^T$$ <Equation b 7>

In Equation 7, when a×4 matrix $[1_v \ I_{bat\_v} \ K_v \ J_v]$ including known values is indicated as 'H' and 4×1 matrix $[V_{oc\_n} \ R_0 V_1(t_{n-a}) \ R_1]^T$ including unknown values is indicated as 'x', Equation 7 may be simplified as the following Equation 8.

$$V_{mod\_v}=Hx$$ <Equation 8>

The least square method associated with the equivalent circuit model 200, used for the control unit 130 to estimate the OCV of the battery 20, may be expressed as the following Equation 9.

$$SSE = \sum_{i=n-a+1}^{n}\{V_{bat}(t_i) - V_{mod}(t_i)\}^2 = \|V_{bat\_v} - Hx\|^2$$ <Equation 9>

In Equation 9, SSE is the sum of squared errors between $V_{bat\_v}$ and $V_{mod\_v}$. The control unit 130 may estimate x by minimizing the SSE of Equation 9 using the following Equation 10.

$$x = (H^T H)^{-1} H^T V_{bat\_v} \qquad \text{<Equation 10>}$$

$V_{oc\_n}$ that is a component included in x estimated using Equation 10 is the estimated voltage value indicating the OCV of the battery 20 estimated at $t_n$.

In step S360, the control unit 130 estimates that the OCV of the battery 20 is equal to the previously estimated OCV. In other words, when the estimated voltage value indicating the previously estimated OCV is $V_{oc\_n-1}$, the control unit 130 sets $V_{oc\_n}$ to the same value as $V_{oc\_n-1}$.

In step S365, the control unit 130 stores the estimated voltage value $V_{oc\_n}$ indicating the estimated OCV of the battery 20 in the memory 110.

In step S370, the control unit 130 determines whether a second number or more of estimated voltage values are sequentially stored in the memory 110. The second number may be 2 or greater. For example, in case that the second number is 5, when at least $V_{oc\_n-4}$, $V_{oc\_n-3}$, $V_{oc\_n-2}$, $V_{oc\_n-1}$ and $V_{oc\_n}$ are sequentially stored in the memory 110, the value of the step S370 is "YES". When the value of the step S370 is "YES", the step S380 is performed. When the value of the step S370 is "NO", the step S394 may be performed. Hereinafter, assume that the second number is 5 for convenience of description.

In step S380, the control unit 130 generates a data set including the second number of estimated voltage values $V_{oc\_n-4}$, $V_{oc\_n-3}$, $V_{oc\_n-2}$, $V_{oc\_n-1}$ and $V_{oc\_n}$ arranged in a sequential order from the second number of estimated voltage values $V_{oc\_n-4}$, $V_{oc\_n-3}$, $V_{oc\_n-2}$, $V_{oc\_n-1}$ and $V_{oc\_n}$ in the order lately stored in the memory 110.

In step S385, the control unit 130 determines whether a calibration condition is satisfied by the data set. The calibration condition may be satisfied when (i) a difference (e.g., $|3.3V - V_{oc\_n}|$) between a reference voltage value (e.g., 3.3V) corresponding to a reference SOC (e.g., 50%) and the estimated voltage value $V_{oc\_n}$ is less than a preset first voltage difference value (e.g., 0.005V), and (ii) a difference (e.g., $|V_{oc\_n-2} - V_{oc\_n-1}|$) between two adjacent estimated voltage values (e.g., $V_{oc\_n-4}$ and $V_{oc\_n-3}$, $V_{oc\_n-3}$ and $V_{oc\_n-2}$, $V_{oc\_n-2}$ and $V_{oc\_n-1}$, $V_{oc\_n-1}$ and $V_{oc\_n}$) in the data set is less than a preset second voltage difference value (e.g., 0.01V).

The memory 110 may store OCV-SOC curve data corresponding one-to-one to each of a plurality of temperature ranges. The control unit 130 may select any one piece of OCV-SOC curve data corresponding to any one temperature range to which a measured temperature value indicating the temperature measured at to belongs, and a correlation between OCV and SOC indicated by the selected OCV-SOC curve data may be represented as the graph shown in FIG. 5. The reference voltage value ('reference OCV' in FIG. 5) corresponding to the reference SOC may be determined from the selected OCV-SOC curve data. The first voltage difference value may be smaller than the second voltage difference value. When the value of the step S385 is "YES", the step S390 is performed. When the value of the step S385 is "NO", the step S394 is performed.

In step S390, the control unit 130 calibrates the updated SOC with the reference SOC. Accordingly, $SOC(t_n)$ indicating the SOC updated in the step S320 may be changed to the same value as the reference SOC.

In step S392, the control unit 130 transmits a notification signal indicating that the SOC of the battery 20 is calibrated to an external device 1 using the communication unit 140. The external device 1 may be, for example, an electronic control unit (ECU) of an electric vehicle in which the battery pack 10 is mounted.

In step S394, the control unit 130 may update the reference SOC. The control unit 130 may update the reference SOC based on the updated SOC $SOC(t_n)$ using the following Equation 11.

$$SOC_{ref}(t_n) = \frac{SOC_{ref}(t_{n-1})\{(t_n - t_r) - \Delta t\}}{t_n - t_r} + \frac{SOC(t_n)\Delta t}{t_n - t_r} \qquad \text{<Equation 11>}$$
$$= \frac{SOC_{ref}(t_{n-1})\{(n - r - 1)\Delta t\}}{\Delta t(n - r)} + \frac{SOC(t_n)\Delta t}{\Delta t(n - r)}$$
$$= \frac{SOC_{ref}(t_{n-1})\{n - r - 1\} + SOC(t_n)}{n - r}$$

In Equation 11, $t_r$ is the past (i.e., $r^{th}$ cycle earlier than the $n^{th}$ cycle) measurement time point (e.g., $t_1$), and $SOC_{ref}(t_{n-1})$ is the previous reference SOC. The updated reference SOC $SOC_{ref}(t_n)$ may correspond to an average SOC for the period from $t_r$ to $t_n$. The reference SOC $SOC_{ref}(t_n)$ updated by the step S394 may be stored in the memory 110. $SOC_{ref}(t_n)$ may be used as the previous reference SOC in the next cycle (i.e., $n+1^{th}$ cycle). According to Equation 11, an advantage is that the reference SOC is periodically updated dependent on the SOC change history of the battery 20. Of course, the reference SOC may not be updated in the step S394, and may be preset.

In step S396, the control unit 130 may control the contactor 30 based on a control signal transmitted from the external device 1 or $SOC(t_n)$ obtained in the step S320. The control signal may be a response of the external device 1 to the notification signal transmitted in the step S392. When $SOC(t_n)$ is outside of a preset normal operating range (e.g., 20~80 [%]), the control unit 130 may turn off the contactor 30 to protect the battery 20 from overcharge and overdischarge. When a difference between $SOC_{ref}(t_n)$ and $SOC_{ref}(t_{n-1})$ is larger than a predetermined value (e.g., 0.3%), the control unit 130 may turn off the contactor 30. It is because a very large difference between $SOC_{ref}(t_n)$ and $SOC_{ref}(t_{n-1})$ represents a high likelihood that an error occurred in at least one of the steps performed to determine $SOC_{ref}(t_n)$.

The embodiments of the present disclosure described hereinabove are not implemented only through the apparatus and method, and may be implemented through programs that realize the functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and some or all the embodiments may be selectively combined together to make various modifications.

DESCRIPTION OF REFERENCE NUMERALS

1: external device
10: battery pack
20: battery
30: contactor
100: battery management system
110: memory
120: sensing unit
130: control unit
140: communication unit
200: equivalent circuit mode
R0: Ohmic resistance
210: parallel RC circuit

What is claimed is:

1. A method for calibrating a state of charge of a battery, the method comprising:
   measuring a terminal voltage and a current of the battery;
   storing, in a memory:
     a measured voltage value indicating the measured terminal voltage; and
     a measured current value indicating the measured current;
   updating a state of charge of the battery using current integration of the measured current value;
   determining in an $n^{th}$ measurement cycle if at least a first number of measured voltage values and at least the first number of measured current values are sequentially stored in the memory, the first number being 2 or greater;
   estimating a voltage value indicating an open-circuit voltage of the battery in the $n^{th}$ measurement cycle based on the first number of measured voltage values and the first number of measured current values in the order stored in the memory if at least the first number of measured voltage values and at least the first number of measured current values are determined to be sequentially stored in the memory, and if not, estimating the voltage value for the $n^{th}$ measurement cycle to be equal to a previously estimated voltage value for an $(n-1)^{th}$ measurement cycle;
   storing the estimated voltage value for the $n^{th}$ measurement cycle in the memory;
   determining whether at least a second number of the estimated voltage values are sequentially stored in the memory, the second number being 2 or greater;
   generating a data set including the second number of estimated voltage values arranged in a sequential order from the second number of estimated voltage values in the order stored in the memory if at least the second number of estimated voltage values are determined to be sequentially stored in the memory;
   calibrating the updated state of charge for the $n^{th}$ measurement cycle by setting the updated state of charge for the $n^{th}$ measurement cycle to be equal to a reference state of charge if a calibration condition is satisfied by the data set; and
   turning off a contactor of the battery if the updated state of charge is outside of a preset normal operating range.

2. The method according to claim 1, wherein:
   the estimating the open-circuit voltage of the battery uses a least square method associated with an equivalent circuit model of the battery; and
   the equivalent circuit model includes a voltage source, an Ohmic resistance, and at least one parallel RC circuit, connected in series.

3. The method according to claim 2, wherein the estimating the open-circuit voltage of the battery is performed based on the first number of measured voltage values and the first number of measured current values in the order stored in the memory if an estimation condition is satisfied by the first number of current values, the estimation condition being whether a change of current for a predetermined time period causes a change in voltage across two ends of each of the Ohmic resistance and the at least one parallel RC circuit.

4. The method according to claim 3, wherein the estimating the open-circuit voltage of the battery comprises estimating that the open-circuit voltage for the $n^{th}$ measurement cycle is equal to a previously estimated open-circuit voltage for the $(n-1)^{th}$ measurement cycle if the estimation condition is not satisfied by the first number of current values.

5. The method according to claim 3, wherein the estimation condition is satisfied if a difference between a maximum current value of the first number of current values and a minimum current value of the first number of current values is equal to or larger than a reference current value.

6. The method according to claim 1, wherein the calibration condition is satisfied if:
   a difference between a reference voltage value corresponding to the reference state of charge and the estimated voltage value is less than a first voltage difference value; and
   a difference between two directly sequential estimated voltage values in the data set is less than a second voltage difference value.

7. The method according to claim 6, wherein the first voltage difference value is smaller than the second voltage difference value.

8. The method according to claim 1, further comprising updating the reference state of charge based on the updated state of charge for the $n^{th}$ measurement cycle.

9. The method of claim 8, further comprising turning off the contactor of the battery if a difference between the reference state of charge and the updated reference state of charge is larger than a predetermined value.

10. The method of claim 8, wherein the updated reference state of charge corresponds to an average state of charge over a time period from a past measurement cycle to the $n^{th}$ measurement cycle.

11. The method of claim 10, wherein the updated reference state of charge is set as a reference state of charge for a next $(n+1)^{th}$ measurement cycle.

12. The method of claim 1, wherein the generating of the data set and the calibrating of the updated state of charge for the for the $n^{th}$ measurement cycle are performed for the $n^{th}$ measurement cycle only if at least the second number of estimated voltage values are determined to be sequentially stored in the memory.

13. A battery management system for calibrating a state of charge of a battery, comprising:
   a memory;
   a sensing unit configured to measure a terminal voltage and a current of the battery; and
   a control unit operably coupled to the memory and the sensing unit, the control unit being configured to:
     store, in the memory:
       a measured voltage value indicating the measured terminal voltage; and
       a measured current value indicating the measured current;

update a state of charge of the battery using current integration of the measured current value;

determine in an $n^{th}$ measurement cycle if at least a first number of measured voltage values and at least the first number of measured current values are sequentially stored in the memory, the first number being 2 or greater;

estimate a voltage value indicating an open-circuit voltage of the battery in the $n^{th}$ measurement cycle based on the first number of measured voltage values and the first number of measured current values in the order stored in the memory if at least the first number of measured voltage values and at least the first number of measured current values are determined to be sequentially stored in the memory, and if not, estimate the voltage value for the $n^{th}$ measurement cycle to be equal to a previously estimated voltage value for an $(n-1)^{th}$ measurement cycle;

store the estimated voltage value for the $n^{th}$ measurement cycle in the memory;

determine whether at least a second number of the estimated voltage values are sequentially stored in the memory, the second number being 2 or greater;

generate a data set including the second number of the estimated voltage values arranged in a sequential order from the second number of estimated voltage values in the order stored in the memory if at least the second number of estimated voltage values are determined to be sequentially stored in the memory;

calibrate the updated state of charge for the $n^{th}$ measurement cycle by setting the updated state of charge for the $n^{th}$ measurement cycle to be equal to a reference state of charge if a calibration condition is satisfied by the data set;

transmit a notification signal indicating that the state of charge of the battery is calibrated by setting the updated state of charge for the $n^{th}$ measurement cycle to be equal to the reference state of charge to an external device; and turn off a contactor of the battery the updated state of charge for the $n^{th}$ measurement cycle is outside of a preset normal operating range.

14. The battery management system according to claim 13, wherein the calibration condition is satisfied if:
a difference between a reference voltage value corresponding to the reference state of charge and the estimated voltage value is less than a first voltage difference value; and
a difference between two directly sequential estimated voltage values in the data set is less than a second voltage difference value.

15. The battery management system according to claim 13, wherein the control unit is further configured to update the reference state of charge based on the updated state of charge for the $n^{th}$ measurement cycle.

16. The battery management system of claim 15, wherein the control unit is further configured to turn off the contactor of the battery if a difference between the reference state of charge and the updated reference state of charge is larger than a predetermined value.

17. The battery management system of claim 15, wherein the updated reference state of charge corresponds to an average state of charge over a time period from a past measurement cycle to the $n^{th}$ measurement cycle.

18. The battery management system of claim 17, wherein the control unit is configured to use the updated reference state of charge as a reference state of charge for a next $(n+1)^{th}$ measurement cycle.

19. A battery pack comprising the battery management system according to claim 13.

20. The battery management system of claim 13, wherein the control unit is configured to generate the data set and to calibrate the updated state of charge for the $n^{th}$ measurement cycle only if at least the second number of estimated voltage values are determined to be sequentially stored in the memory.

* * * * *